(12) United States Patent
Gudesen et al.

(10) Patent No.: US 6,498,744 B2
(45) Date of Patent: Dec. 24, 2002

(54) FERROELECTRIC DATA PROCESSING DEVICE

(75) Inventors: Hans Gude Gudesen, Brussels (BE); Per-Erik Nordal, Asker (NO); Geirr Ivarsson Leistad, Sandvika (NO)

(73) Assignee: Thin Film Electronics ASA, Oslo (NO)

( * ) Notice: Subject to any disclaimer, the term of this patent is extended or adjusted under 35 U.S.C. 154(b) by 17 days.

(21) Appl. No.: 09/978,034

(22) Filed: Oct. 17, 2001

(65) Prior Publication Data

US 2002/0044480 A1 Apr. 18, 2002

Related U.S. Application Data

(62) Division of application No. 09/463,982, filed as application No. PCT/NO98/00237 on Aug. 13, 1998.

(30) Foreign Application Priority Data

Aug. 15, 1997 (NO) .......................................... 19973782

(51) Int. Cl.⁷ ............................................... G11C 11/22

(52) U.S. Cl. ........................................ 365/145; 365/65

(58) Field of Search .......................... 365/145, 65, 109, 365/117; 257/295

(56) References Cited

U.S. PATENT DOCUMENTS

| | | | |
|---|---|---|---|
| 5,329,485 A | | 7/1994 | Isono et al. |
| 5,375,085 A | | 12/1994 | Gnade et al. |
| 5,500,749 A | | 3/1996 | Inaba et al. |
| 5,579,257 A | * | 11/1996 | Tai .............................. 365/145 |
| 5,592,409 A | | 1/1997 | Nishimura et al. |
| 5,666,305 A | * | 9/1997 | Mihara et al. ............... 365/145 |

FOREIGN PATENT DOCUMENTS

| | | |
|---|---|---|
| EP | 0 721 189 | 7/1996 |
| WO | 97/48009 | 12/1997 |
| WO | 98/58383 | 12/1998 |
| WO | 99/08325 | 2/1999 |

OTHER PUBLICATIONS

IBM Technical Disclosure Bulletin, vol. 37, No. 11, Nov. 1994 "Ultrafast Nonvolatile Ferroelectric Information Storage Device" p. 421–424.
Patent Abstract of Japan, vol. 17, No. 477 (P–1603)— Abstract of JP 5–114284, Olympus Optical Co. Ltd., May 7, 1993.
Patent Abstracts of Japan No. 6–131866 A, Olympus Optical Co. Ltd. May 13, 1994.

(List continued on next page.)

*Primary Examiner*—David Lam
(74) *Attorney, Agent, or Firm*—Jacobson Holman, PLLC

(57) ABSTRACT

In a ferroelectric data processing device for processing and/or storage of data with passive or electrical addressing a data-carrying medium is used in the form of a thin film (1) of ferroelectric material which by an applied electric field is polarized to determined polarization states or switched between these and is provided as a continuous layer in or adjacent to electrode structures in the form of a matrix. A logic element (4) is formed at the intersection between an x electrode (2) and a y electrode (3) of the electrode matrix. The logic element (4) is addressed by applying to the electrodes (2, 3) a voltage greater than the coercivity field of the ferroelectric material. Dependent on the polarization state and the form of the hysteresis loop of the ferroelectric material a distinct detection of the polarization state in the logic element (4) is obtained and it may also be possible to switch between the polarization states of the logic element, which hence may be used for implementing a bistable switch or a memory cell. The data processing device according to the invention may be stacked layerwise if the separate layers are separated by an electrical isolating layer and hence be used for implementing volumetric data processing devices.

9 Claims, 5 Drawing Sheets

OTHER PUBLICATIONS

Figure 1:
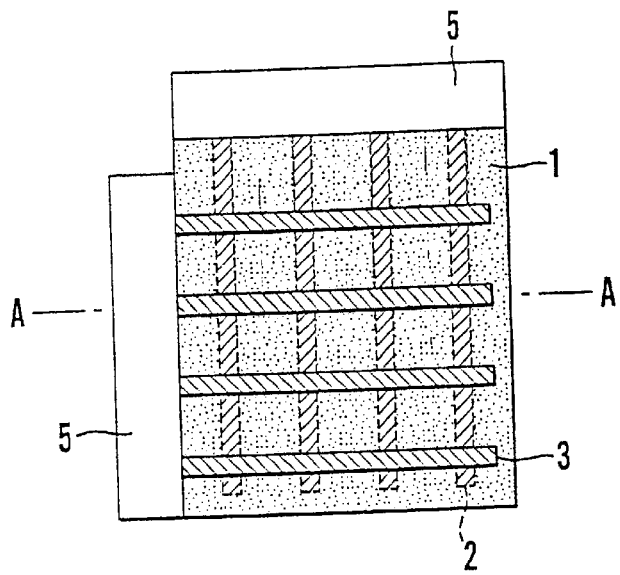

Patent Abstract of Japan, vol. 10, No. 209 (E–421)—Abstract of JP 61–48983 A Toray Ind. Inc. Mar. 10, 1986.
Transducers Based on Hysteresis Loops and Nonlinear P.E Relations, pp. 125–130, Gordon and Breach, 1982.
R.G. Kepler and R.A. Anderson, Advances in Physics, vol. 41, No. 1, pp. 1–57 (1992).
W.J. Merz and J.R. Anderson titled "Ferroelectric Storage Devices", which was published in Sep. 1955 (Bell Lab Records, 1:335–342 (1955)).
J.F. Scott, Ferroelectric memories, Physics World, Feb. 1995, pp. 46–50.

M. Date & al. "Opto–ferroelectric Memories using Vinylidene Fluoride and Trifluoroethylene Copolymers", IEEE Trans. Electr. Ins., vol. 24, No. 3, Jun. 1989, pp. 537–540.

Y. Tajitsu & al. "Investigation of Switching Characteristics of Vinylidene Fluoride/Triflouroethylene Copolymers in Relation to Their Structures", (Japanese Journal of Applied Physics, 26, pp. 554–560 (1987)).

* cited by examiner

FERROELECTRIC DATA PROCESSING DEVICE

This is a divisional of application Ser. No. 09/463,982 filed Feb. 15, 2000, which in turn is a national phase application under 35 USC §371 of PCT International Application No. PCT/NO98/00237 which has an International Filing Date of Aug. 13, 1998, which designated the United States of America and was published in English and claims priority from 973782 filed Aug. 15, 1997, in Norway.

The present invention concerns a ferroelectric data-processing device, particularly for processing and/or storage of data with active or passive electrical addressing, comprising a data-carrying medium in the form of a thin film of ferroelectric material, wherein the ferroelectric material by an applied electric field may attain a first or a second polarization state by being switched from a disordered state to one of the polarization states or from the first to the second polarization state or vice versa, wherein the ferroelectric material comprises logic elements, wherein a polarization state assigned to a logic element represents a logical value of the logic element, wherein the ferroelectric thin film is provided as a continuous or patterned layer, wherein a first and second electrode structure each comprises substantially mutually parallel strip-like electrodes, such that the electrode structures mutually form a substantially orthogonal x,y matrix, wherein the electrodes in the first electrode structure constitute the columns of the electrode matrix or the x electrodes and the electrodes in the second electrode structure the rows of the electrode matrix or y electrodes, wherein a portion of the ferroelectric thin film at the overlap between an x electrode and a y electrode of the electrode matrix forms a logic element such that the logic elements jointly form an electrically connected passive matrix in the data-processing device.

The present invention also concerns a method for manufacturing the ferroelectric data-processing device, as well as a method for readout in the addressing of logic elements in a ferroelectric data-processing device, particularly a ferroelectric data-processing device according to claims 1–9, wherein the method supports a protocol for readout and comprises steps for respectively reading, verification and reset. Finally the invention concerns the use of a ferroelectric data-processing device according to the invention.

Generally the invention concerns data-processing devices with logic elements implemented in a ferroelectric material. The phenomena of ferroelectricity is in this connection supposed known by persons skilled in the art, as the field is comprehensively treated in the literature, for instance in J. M. Herbert, Ferroelectric Transducers and Sensors, Gordon and Breach, 1982, wherein in pp. 126–130 there is proposed using a ferroelectric memory based on single crystals of barium titanate provided between orthogonal electrodes in an x,y electrode matrix. The author concludes that there are substantial practical difficulties connected with the use of ferroelectric single crystals for information storage in this simple manner. In regard of recent survey literature, reference may be made to R. G. Kepler and R. A. Anderson, Advances in Physics, Vol. 41, No. 1, pp. 1–57 (1992).

To illustrate the development of ferroelectric memories in a historical context, reference may be made to a paper by W. J. Merz and J. R. Anderson titled "Ferroelectric Storage Devices", which was published in September 1955 (Bell Lab. Records, 1:335–342 (1955)) which discloses the use of inorganic ferroelectric crystalline materials, particularly barium titanate in, in memory and switching devices. Particularly they suggest a ferroelectric memory device based on this material, the latter being provided as a planar 50–100 $\mu$m thick slab between overlapping sets of parallel electrodes, one set of the electrodes being orthogonal to the electrodes of the other and thus providing ferroelectric memory cells in portions of the ferroelectric material between the overlapping electrodes. Thus they disclose a ferroelectric device with a passive electrode matrix for addressing (see FIG. 10 of their paper), anticipating the general layout of all later ferroelectric memory devices with matrix-based addressing. They even hint at the use of transistors for switching, but forming an active memory cell with a switching transistor and with sufficiently small dimension would hardly be practical before the advent of say integrated field effect transistors.

As mentioned above, the data-processing medium is a ferroelectric material in the form of thin film. Such ferroelectric thin films which either may be inorganic, ceramic materials, polymers or liquid crystals have been known for some time and it may in this connection be referred to the above-mentioned article by Kepler and Anderson. There are for instance from J. F. Scott, Ferroelectric memories, Physics World, February 1995, pp. 46–50, known data storage devices based on ferroelectric memory materials. They all have in common that at least one transistor is necessary in each bit location or memory cell. In the most common embodiments the ferroelectric material is used as a dielectric in the associated memory circuit and comprises a bit-storing capacitor. Due to the high dielectric constant of ferroelectric materials, the capacitor may be made much smaller than otherwise possible and will additionally provide a quite superior charge lifetime. Recently the development has focused on another property of ferroelectric materials, namely their ability to be polarized electrically when they briefly are subjected to a strong electric field. During the polarization process the dipoles of the ferroelectric material attain a preferred orientation, something which results in a macroscopic dipole moment which is retained after the removal of the polarizing field. By thus including the ferroelectric material in the gate electrode structure of a field effect transistor in the memory cell circuit, the transconductance characteristics of the transistors may be controlled by controlling the polarization state of the ferroelectric material. The latter may be switched, for instance by polarizing fields with a direction which either causes a transconductant state "on" or "off" in the transistor.

EP patent 0 721 189 discloses a ferroelectric memory with discrete memory cells provided in an electrode matrix. In addition to a discrete ferroelectric capacitor each memory cell also comprises switching means, preferably in the form of at least one transistor. The discrete memory cells hence do not form a passive matrix. With discrete memory cells it shall here be understood that the ferroelectric capacitor is formed by a discrete component, such that the ferroelectric material cannot form a continuous layer in the matrix. There are provided separate data and selection lines and the readout of a stored datum may take place in current or voltage mode on data lines provided for this purpose, but according to a relatively complicated protocol, such as disclosed by patent claim 6. It must also be remarked that the number of memory cells connected in a data signal line must be adjusted in order to accommodate parasitic capacitance on each data signal line during the readout, such that the voltage variation on one of the data signal lines is minimized.

U.S. Pat. No. 5,592,409 concerns a non-volatile ferroelectric memory wherein data may be read out without destruction. The memory cells are included in an active matrix and are formed as transistor structures therein, wherein the gate electrode forms one of the electrodes in a ferroelectric capacitor. It is evident that the ferroelectric capacitors are discrete components. The polarization of the capacitor takes place in a well-known manner, but by the readout which takes place in current mode it is the drain current that is detected, this in order to prevent the stored data from being erased.

Even if the use of ferroelectric materials as mentioned above represents substantial improvements relative to alternative technologies for storage of data, the basic architecture of ferroelectrically based memories is directed to the use of active microcircuits included in each memory cell. This has negative consequences for the achievable data storage density, i.e. the number of bits which may be stored on a given surface area, as well as for the cost of each bit stored, something which partly may be due to complicated manufacturing technology and the use of active semiconductive components.

Recently proposals have been made for a return to ferroelectric memory devices configured as a memory cell array in a passive electrode matrix. Thus U.S. Pat. No. 5,329,485 (U. Isono & al.) discloses a memory element and a matrix memory cell array including memory cells each having a non-linear conductivity bipolar switching element constituted by a multi-layered structure which performs writing/reading operations of a polarization state on a ferroelectric body which forms a recording medium of the memory cell. The switching element is in the form of an insulating film which acts as a switching element to accumulate charges in a charge accumulating ferroelectric capacitor which constitutes the memory cell proper. The insulating film, which particularly may be a polyimid film, allows a direct tunnel current to flow when a voltage exceeding a predetermined value is applied to the insulating film. When the voltage is turned off, the film recovers its insulating property and retains the charges by preventing leakage thereof. According to Isono & al. the film shall have non-linear current voltage characteristics and provides a high write speed without a high operation voltage due to a large part of the drive current of the insulating film being a direct tunnel current. This also allow a high integration density of the memory cells, while the switching film forming a diode junction in the memory cell reduces crosstalk between the cells.

U.S. Pat. No. 5,375,085 discloses another example of a ferroelectric memory in the form of a ferroelectric integrated circuit realized with a passive electrode matrix with a ferroelectric layer provided between the electrode sets forming the substantially orthogonal matrix. As usual, the memory cell is formed in the portion of the ferroelectric layer between the overlapping electrode of each electrode set. By providing an insulating layer over the electrode matrix a second electrode matrix may be deposited on the top of the former and so on, thus forming a stacked structure realizing a volumetric three-dimensional ferroelectric integrated circuit with passive matrix addressing. This is, however, already known from the above-mentioned U.S. Pat. No. 5,329,485, see for instance column 14, 1. 31–36 thereof.

Additionally it could also be mentioned that passive matrix addressing is, of course, well-known in the case of ferroelectric liquid crystal elements as for instance used in liquid crystal displays. Reference may in this regard be made to e.g. U.S. Pat. No. 5,500,749 (Inaba & al.)

It has also been shown that ferroelectric polymer materials may be used in erasable optical memories. For instance there are disclosed devices for ultrafast non-volatile information storage with ferroelectric polymers as the active storage elements (IBM Technical Disclosure Bulletin 37:421–424 (no. 11, (1994)). Preferred embodiments utilize poly(vinylidene fluoride) (PVDF) or PVDF-trifluoroethylene (PVDF-TrFE) copolymers as the ferroelectric material since these polymers can be obtained as very thin films and can have response times of better than 350 picoseconds. The ferroelectric polymers can be used in the gate of a standard dynamic or static RAM device. The most basic information storage device suggested consists of a ferroelectric thin film with a set of parallel conducting electrodes deposited on one side and an orthogonal set of conducting electrodes deposited on the other side. The individual storage cells are formed at the junctures of the opposing electrodes. A stack of two-dimensional passive arrays of this kind can be fabricated by alternately depositing conducting strips and ferroelectric material to build up a three-dimensional array of ferroelectric capacitors which easily could be stacked vertically on an integrated circuit with addressing logic sense amplifiers and thus providing a volumetric or three-dimensional ferroelectric memory.

Further, M. Date & al. has in the paper "Opto-ferroelectric Memories using Vinylidene Fluoride and Trifluoroethylene Copolymers", IEEE Trans. Electr. Ins., Vol. 24, No. 3, June 1989, pp. 537–540, proposed a data medium comprising a dye-doped vinylidene fluoride trifluoroethylene copolymer with a thickness of 2 $\mu$m, spin deposited on a ITO coated glass plate. The information is written as sequences of positive and negative polarizations generated by irradiating with a focused laser beam with a diameter of about 5 $\mu$m in the presence of sign controlling electric fields. The data is read out pyroelectrically by scanning with a laser beam. A carrier/noise ratio of 48 dB has been obtained by using a regularly repeating data train in the form or 0/1-state with a pitch of 20 $\mu$m and with the use of a laser power of 12 mW and field strength of 25 MV/m. The reading speed was then 100 mm/s.

A disadvantage shared by all prior art ferroelectric memory devices is that the arrangement of the electrode matrix gives rise to serious fabrication problems when an organic ferroelectric memory medium is used in combination with inorganic, i.e. metallic, electrode strips and inorganic substrates, due to the need for processing the various materials in different thermal regions. Realized as thin film structures both organic materials as well as crystalline inorganic ferroelectric materials have turned out to be thermally incompatible with the temperatures required for processing the other materials of the device.

The object of the present invention is thus to provide a simple logic architecture which may be used for realizing either bistable switches or memory cells in a data-processing device or to provide a purely ferroelectric data storage device which offers the possibility of storing a very high number of bits in an area unit and which at the same time may be produced in simple manner in high volume with low cost, such that the above-mentioned disadvantages of the prior art thin film devices are avoided.

This object and other advantages are achieved according to the invention with a ferroelectric data-processing device which is characterized in that a layer of an electrical isolating material is provided between and adjacent to the electrodes of the first and the second electrode structure, that the ferroelectric thin film is provided in the form of a continuous or patterned layer over the electrode structures on one side thereof, and that the logic elements are formed respectively in a portion of the ferroelectric thin film along the side edges of an y electrode at the overlap between the x electrode and the y electrode; a method for manufacturing a ferroelectric data-processing device characterized by successive steps for depositing a first electrode structure on a substrate, depositing a layer of electrical isolating material over the first electrode structure, depositing a second electrode structure over the isolating layer, removing the isolating layer where it is not covered by the second electrode structure, such that the electrodes in the first electrode structure is exposed except in the overlapping intersections between the electrodes of respectively the first and the second electrode structure, and depositing a ferroelectric thin film in the form of a continuous or patterned layer over the electrode structures; and a method for readout characterized by applying in the reading step a voltage with a determined polarization to a logic element and detecting a charge transfer between the electrodes thereof as an either high or low first current value indicative of a logical value stored in the logic element, applying in the verification step a voltage of the opposite polarity to that of the voltage applied in the reading step and detecting a charge transfer between the electrodes of the logic element as a high second current value, and, in the case the logical value stored in the logic element was destroyed in the reading or the verification step, applying in the step for reset a voltage to the logic element restoring an initial polarization state thereof.

Advantageously, a logic element forms a bistabile switch in a data processor means or a memory cell in a data storage means.

According to a preferred embodiment of the invention the electrode structures and the ferroelectric thin film are provided on a substrate.

According to the invention the ferroelectric thin film is advantageously formed of a ceramic material or a ferroelectric liquid crystal material or a polymer, the polymer preferably being polyvinylidene fluoride, or a copolymer, the copolymer preferably being a vinylidene fluoride/trifluoroethylene copolymer.

In the method for manufacturing the ferroelectric data-processing device it is according to the invention advantageous that the substrate is formed of a crystalline, polycrystalline or amorphous semiconducting material, for instance silicon.

Advantageously, a continuous layer of an electrical isolating material is deposited between the substrate and the first electrode structure before depositing the first electrode structure on the substrate.

In a first embodiment of the method for readout reset is performed after reading without verification by applying a voltage of the opposite polarity to that of the reading voltage only in the case of detecting a high current signal in the reading step.

In a second embodiment of the method for readout reset is performed after reading in conjunction with verification by applying a voltage of the same polarity as that of the reading voltage only in the case of detecting a low current signal in the reading step.

In the method for readout according to the invention it is particularly preferred applying a voltage which between the electrodes of the logic element generates a field strength which is more than twice the coercivity field of the ferroelectric material. Advantageously, the applied voltage is generated as a ramp voltage or a threshold voltage in the reading and/or verification steps. According to the invention it is preferred that the current detection in the reading step takes place either by sampling in the time domain or in a time window dependent on the saturation time constant of the polarization. Advantageously the current detection, particularly in the latter case, takes place by a level comparison.

Figure 2:
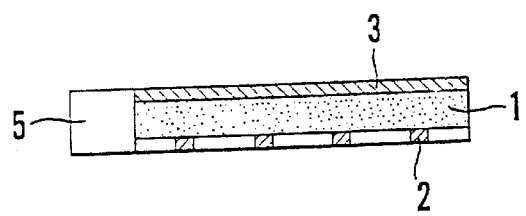
Figure 3A:
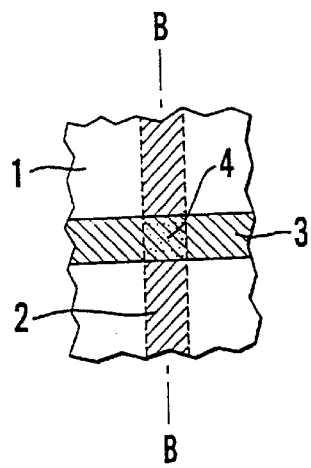
Figure 3B:
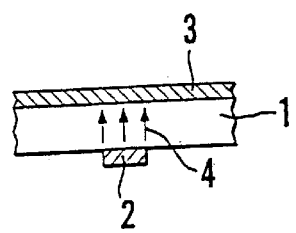
Figure 4:
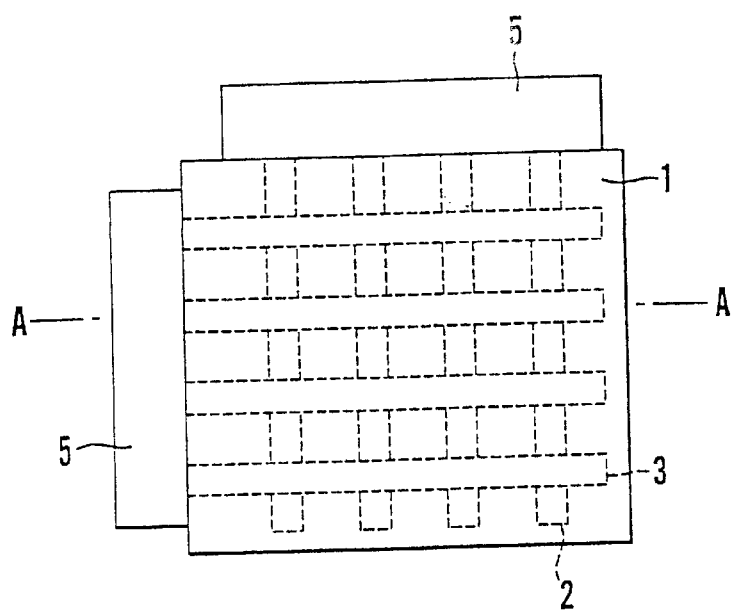
Figure 5:
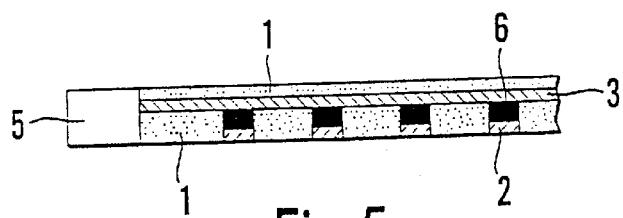
Figure 6A:
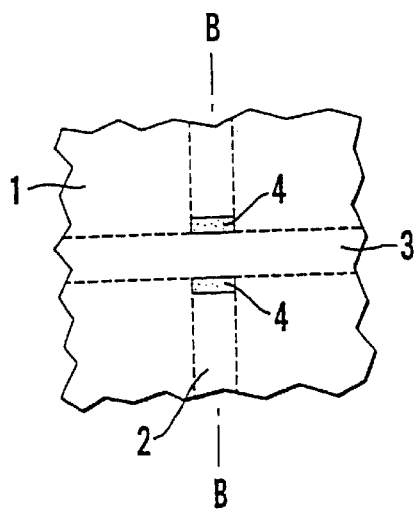
Figure 6B:
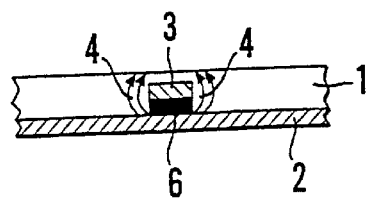
Figure 7:
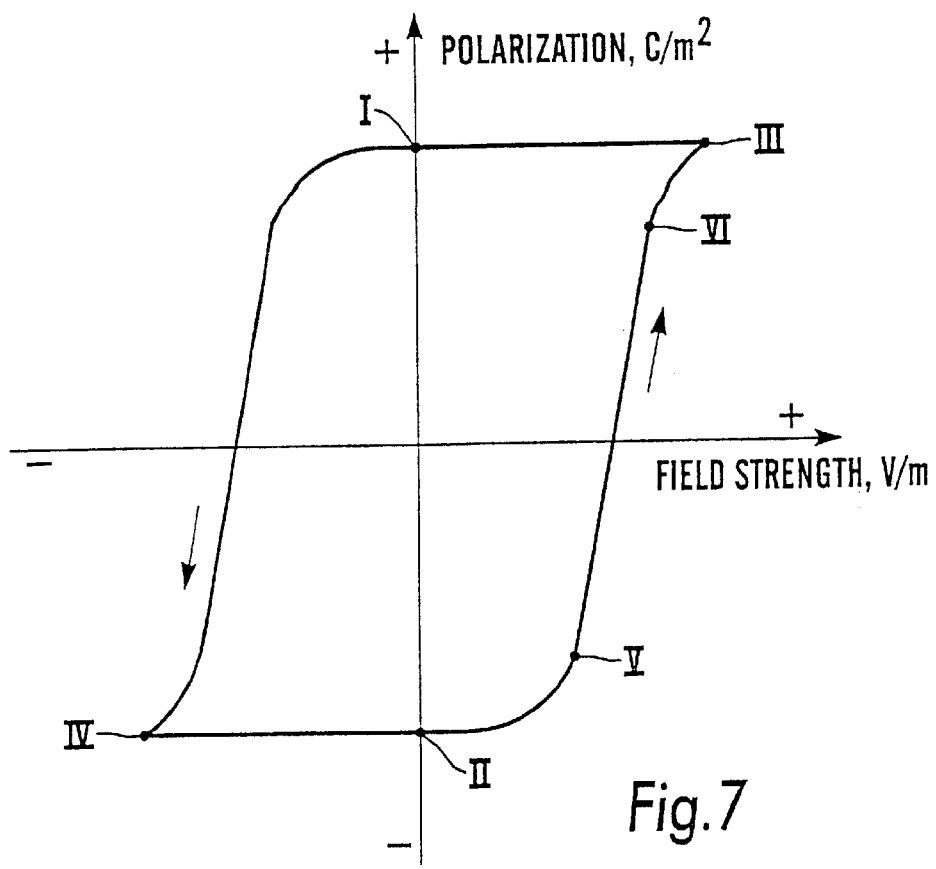
Figure 8:
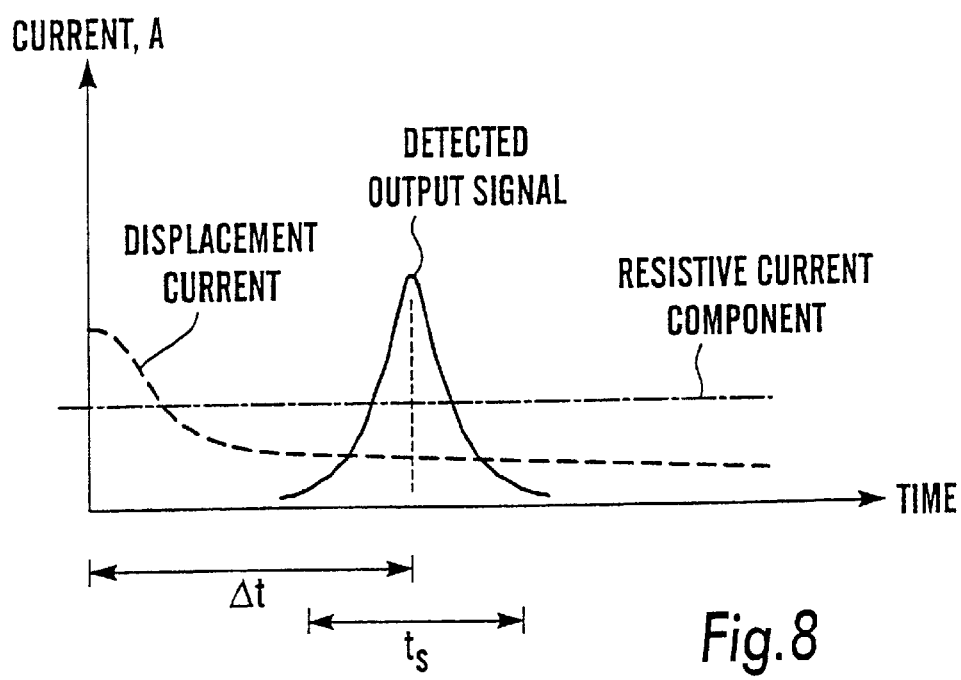
Figure 9:
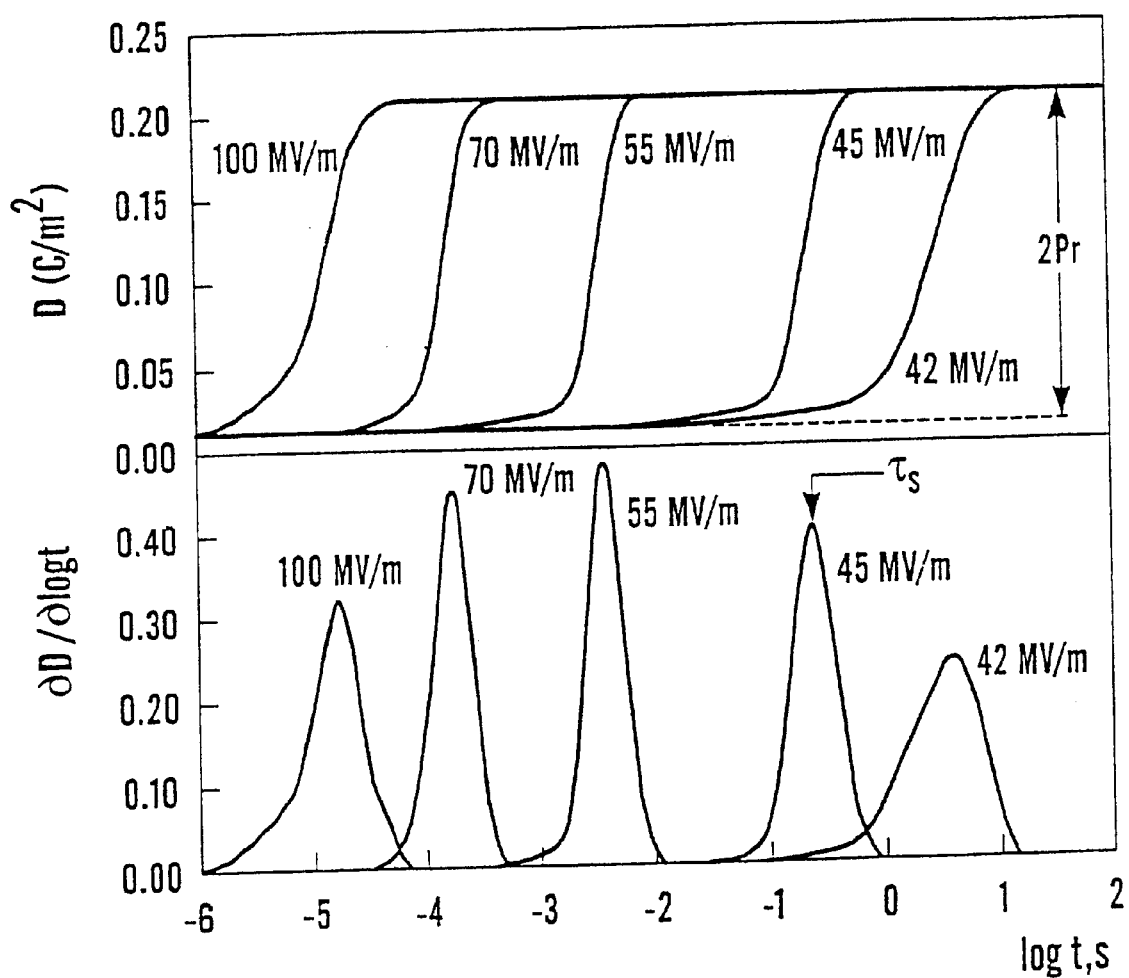
Figure 10:
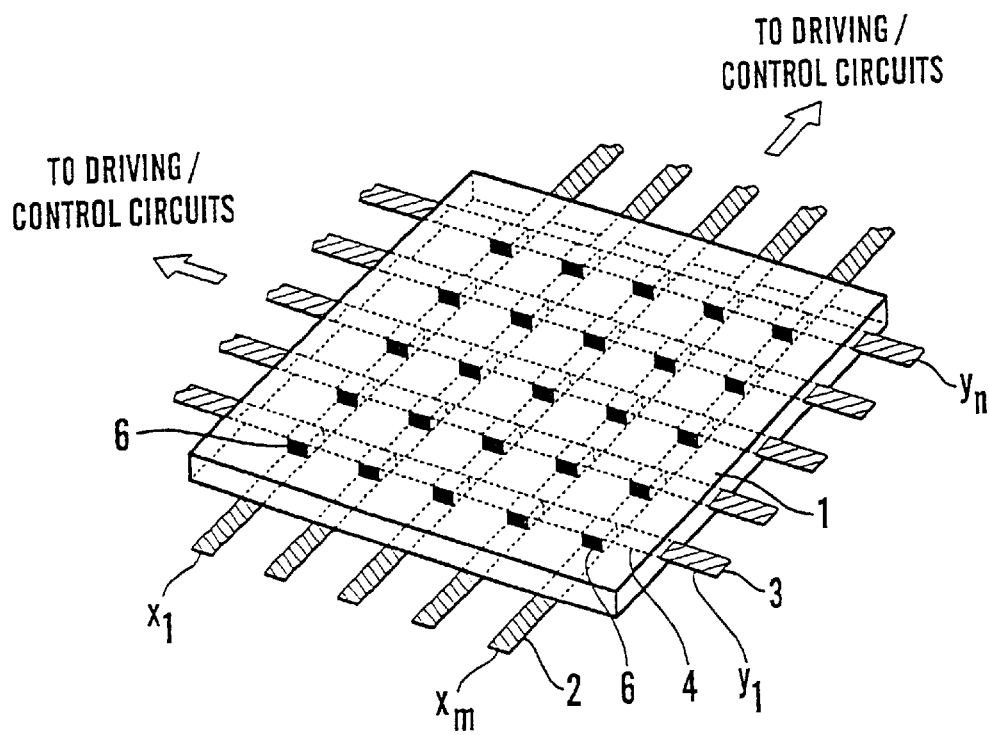
Figure 11:
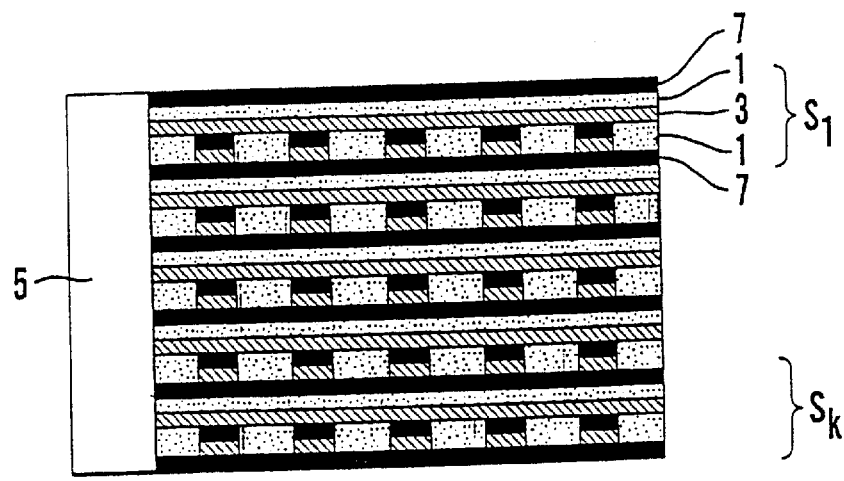

The invention shall now be explained in a more detail in connection with examples of embodiments of both the data-processing device and the method and with reference to the accompanying drawing, wherein FIG. 1 shows prior art embodiment of a ferroelectric data-processing device according to the invention, seen in plan view, FIG. 2 the prior data-processing device in FIG. 1 in a schematic section taken along the line A—A in FIG. 1, FIG. 3a a plan view of a logic element in the prior art data-processing device in FIG. 1, FIG. 3b schematically the polarization of the logic element in FIG. 3a, FIG. 4 an embodiment of the data-processing device according to the present invention, seen in plan view, FIG. 5 the data-processing device in FIG. 4 in a schematic section taken along line A—A in FIG. 4, FIG. 6a a plan view of a logic element in the data-processing device in FIG. 4, FIG. 6b schematically the polarization of the logic element in the data-processing device in FIG. 4, FIG. 7 a typical hysteresis loop for the polarization of a ferroelectric copolymer material as used in the data-processing device according to the invention, FIG. 8 a diagram of the time response of a detected output signal from the data-processing device according to the invention, FIG. 9 a diagram of the switching characteristics of a ferroelectric copolymer material, FIG. 10 schematically and in perspective the data-processing device in FIG. 4 as an x,y electrode matrix with x=y=5, and FIG. 11 the data-processing device corresponding to that in FIG. 10 and arranged in stacked layers in order to implement a volumetric configuration.

In the following examples of embodiments of the ferroelectric data-processing device according to the invention shall be disclosed in connection with data-processing devices with the logic element configured as memory cells, i.e. the device in its entirety implementing a data-storing device. Similarly there shall in the following only be referred to the use of passive electric addressing of the individual logic element.—Before the inventive device is discussed in more detail shall, however, a prior art ferroelectric data storage device as depicted in FIG. 1 briefly shall be described.

FIG. 1 shows the prior art data storage device with a ferroelectric thin film 1 provided between a first and second electrode structure. The first and the second electrode structures form as shown in the plan view in FIG. 1 a two-dimensional x,y-matrix with the electrodes 2 of the first electrode structure as columns in the matrix or x electrodes and the electrodes 3 in the second electrode structure as rows in the matrix or y electrodes. Electrodes 2, 3 are connected to respective driver and control circuits 5 for driving the electrodes and detection of output signals.

The electrodes 2,3 and the ferroelectric thin film are as shown in section in FIG. 2 taken along the line A—A in FIG. 1, provided in sandwich configuration between a not shown overlying and underlying substrate which for instance may consist of crystalline silicon. The substrates are for the sake of clarity also left out in FIG. 1. Between the respective substrates and the electrodes 2, 3 and the ferroelectric thin film 1 there may be provided not shown layers of electrical isolating material. As the substrates themselves have been made in semiconductor material, the driver and control circuits 5 may advantageously be made integrated with the substrates in a compatible technology, for instance along a side edge of the data-processing device as suggested.

FIG. 3a renders enlarged the overlapping intersection between an x electrode 2 and a y electrode 3 as well as the active area 4 which constitutes a logic element in the ferroelectric thin film 1. This active area 4 will, when applying to the electrodes 2, 3 a drive voltage which generates an electric field between the x electrode and the y electrode 3, be polarized electrically in a direction which is determined by the sign of the drive voltage or the polarization voltage. The logic element 4 with the active area in the ferroelectric thin film 1 between the electrodes 2, 3 taken along the line B—B in FIG. 3a, is shown schematically in polarized state in FIG. 3b which implies a polarization in the direction "up" which for instance may correspond to the positive polarization and hence represent a state logic 0 or logic 1 in the logic element 4 or in the memory cell formed in the volume of the ferroelectric thin film 1 in the overlapping intersection between the x electrode 2 and the y electrode 3. The detection of the polarization state, i.e. whether it is positive or negative, may now quite simply take place by passively addressing the logic element 4 with a voltage and by detecting the polarization state as representative for a determined logical state in the logic element 4 by the charge transfer between the electrodes 2, 3 during the addressing, hence in current mode. The output signal is registered by the control circuits and corresponds to the reading of the logical value assigned to the logic element 4 or memory cell by its present polarization state. This shall, however, be discussed in more detail in connection with the following description of the addressing of the data-processing device according to the present invention.

A data-processing device according to the invention is shown in FIG. 4. Herein the electrode structures are realized in a bridge configuration which, however, per se is known from NO patent application 973390, filed Jun. 17, 1997 and assigned to the present applicant. (The corresponding PCT application NO98/00212 has now been published as WO99/08325). As before, the electrodes 2; 3 in each structure are provided above each other in a matrix-like configuration and between not shown substrates which once again may be of crystalline silicon, as it is shown by the section in FIG. 5 which is taken along the line A—A in FIG. 4. In contrast with the prior art device the ferroelectric thin film 1, however, is provided over the electrode structures. The electrodes 2 of the first electrode structure are electrically isolated from the electrodes 3 in the second electrode structure by providing a layer 6 of electrical isolating material in the intersection between the electrodes 2, 3. The active area in the ferroelectric thin film 1 and which comprises the logic element 4 itself, will thus appear as shown in plan view in FIG. 6a and in section shown in FIG. 6b taken along the line B—B in FIG. 6a. In FIG. 6b also the polarization of the active area is shown for a corresponding polarization as in FIG. 3b, but with the field lines curved along the side edges of the isolation layer in the active area. The drive and control circuits may be realized in semiconductor technology and provided in the not shown semiconductor substrate or as separate circuit modules 5 provided along the side edges of the matrix as disclosed by FIGS. 4 and 5.

In the manufacturing of the embodiment shown in FIGS. 4 and 5 the first electrode structure is deposited on a substrate and then covered by an isolating layer 6. On the top of the isolating layer 6 the second electrode structure is now deposited, such that the first and the second electrode structure once again form a two-dimensional matrix configuration wherein the x electrodes 2 are the columns and the y electrode 3 the rows. In the areas where the isolating layer 6 is not covered by the electrodes 3 in the second electrode structure, the isolating material is now etched away, such that the electrodes 2 in the first electrode structure still are completely electrically isolated from the electrodes 3 of the second electrode structure at the intersection of the electrodes, but else exposed. The ferroelectric thin film 1 is now provided over the electrode structures before all parts possibly also are covered by an overlying substrate. As shown in FIG. 4 or 5 the ferroelectric thin film is provided as continuous layer, but it may also in a variant embodiment be patterned such the electrodes are covered only in and around the intersections thereof by a patch of thin-film ferroelectric material, in analogy with a variant embodiment already disclosed in the above-mentioned NO application no. 973390. Otherwise the embodiment is wholly similar to that shown for the prior art device in FIGS. 1 and 2. One advantage of the embodiment in FIGS. 4 and 5 is that the electrode structures and the accompanying connections and driver and control circuits are provided on for instance crystalline silicon substrates before the ferroelectric thin film is applied. Hence the different process steps which are included in the manufacturing of the active circuit elements in semiconductor technology may be performed without disturbing the ferroelectric thin film which for instance may be a polymer with a limited temperature tolerance.

There are a number of ferroelectric materials which may be used in the ferroelectric thin film. The ferroelectric material may e.g. be an inorganic ceramic material as lead zirconate titanate, a ferroelectric liquid crystal material or thin films of polymers. One instance of the latter is a copolymer of vinylidene fluoride (called VF2 or VDF) and trifluoroethylene ($C_2F_3H$, called TFE) where the relative content of each component in thin film may be varied in order to obtain different properties. Such copolymers may typically have a low coercivity field and show a more square hysteresis loop than which is the case for pure vinylidene fluoride polymers.

The switching characteristics of ferroelectric polymers realized as vinylidene fluoride/triflouroethylene copolymers are discussed in a paper by Y. Tajitsu & al. with the title "Investigation of Switching Characteristics of Vinylidene Fluoride/Triflouroethylene Copolymers in Relation to Their Structures", (Japanese Journal of Applied Physics, 26, pp. 554–560 (1987)) and shall be regarded as a general reference in connection with the following description of the addressing of a logic element or a memory cell in the data-processing device according to the invention.

FIG. 7 shows the hysteresis loop for the polarization of a ferroelectric thin film for instance made of vinylidene fluoride/trifluoroethylene copolymer.

Polarization in $C/m^2$ is shown on the y axis and the interelectrode field strength in V/m on the x-axis. The ferroelectric thin film between the electrodes will initially be in a disordered or unpolarized state and be polarized when applying to the electrode s a voltage which generates a field strength between electrodes greater than the coercivity field of the ferroelectric material. The ferroelectric material will dependent on the sign of the polarization voltage attain an electric polarization with preferred orientation "up" represented by the point I or the hysteresis loop or "down" represented by point II on the hysteresis loop. The polarization states I and II may also be used to represent a logic 0 or a logic 1 or vice versa. It shall be remarked that the concepts "positive", "negative", "up", "down" of course, must be regarded as conventionally normative, as they are determined as soon as a determination has been made as to what shall be regarded as the positive or negative electrode or the polarization "up" or the polarization "down". A corresponding convention will be valid for the choice of which polarization state which shall be regarded as logic 1 or logic 0, and this should not lead to problems provided a determined protocol is strictly adhered to.

Consequently a logic element of a ferroelectric material which are in one of two polarization states may represent a logic 0 or 1 or a binary 0 or 1 and be implemented as either bistable switches in a data-processing device or memory cells in a data storage device. The polarization of the logic element to a determined state represent in other words writing of data to this logic element.

It may be mentioned that the polarization of suitable ferroelectric materials used in a logic element may take place at room temperature and with high speed by choice of suitable ferroelectric materials and the use of a correspondingly high field strength by the polarization voltage applied to the electrodes of the logic element. When the ferroelectric material is provided as a thin film, this comports a number of advantages. As soon as the logic element, i.e. the ferroelectric thin film material in the logic element has been given a preferred polarization, this polarization state will last for an indefinite time period at room temperature and in any case for many years unless the polarization state is reversed by using a polarization field with opposite sign. A cancellation of the polarization state may take place in analogy with ferromagnetic demagnetization by running the logic element through a cyclic depolarization field. Strong heating of the logic element also may lead to a destruction of the polarization state by the electric dipoles loosing their preferred orientation.

The polarization direction along the hysteresis loop when applying a polarization field is indicated with the arrows between the points I and IV, and V and VI.

The readout of data from the logic element shall now be discussed in somewhat greater detail, also in connection with the hysteresis loop shown in FIG. 7. Once more references to expressions such as logic 0 and logic 1 or "up" or "down" shall be avoided and there shall only be spoken of positive or negative polarization, represented respectively by the portion of the hysteresis loop which is located above the x axis and the portion of the hysteresis loop which is located below the x axis. If the logic element now is in a positive polarization state, represented by the point I on the hysteresis loop, the readout takes place by applying to the electrodes a voltage which preferably generates a field strength of about two times the coercivity field or more. The polarization of the logic element will hence move from the point I to III, provided that the read voltage has a positive sign. Due to the form of the hysteresis loop which in this case is very close to being square, a change of the polarization state from I to III will lead to a wholly insignificant charge transfer between the electrodes, and by the detection of charge transfer between the electrodes in the connected control circuit a very weak current signal will be obtained. If the logic element, however, is in a negative polarization state, represented by the point II on the hysteresis loop, the detected output current will by applying to the electrodes a positive voltage for the readout, first rise insignificantly and thereafter give a very sharply defined transient current pulse which represents the course between the points V and VI on the hysteresis loop where the charge transfer is large. Between the points I and II on the hysteresis loop the circumstance of a relatively flat hysteresis loop in other words will imply that the polarization only changes very little during the application of a positive voltage field, while the change during the application of a corresponding positive voltage when the logic memory element is at point II on the hysteresis loop will cause a very large change of the polarization and particularly a substantial part of the change will take place between the points V and VI on the steepest portion of the hysteresis loop and also take place in a very short time period, something which results in the above-mentioned current transient as the detected output signal. This will also make it easy to discern in the readout between e.g. a logic 0 represented by the polarization state in the point I on the hysteresis loop and a logic 1 correspondingly represented by the point II on the hysteresis loop. The points III and IV on the hysteresis loop represent the saturation state for respectively the positive and the negative polarization, and when the applied electrical field is removed, the polarization will drift back respectively from III to I and from IV to II on the hysteresis loop. It shall, of course, be understood that in order to drive the polarization from I to III the field must according to the convention followed here be positive, while it for driving the polarization from state II to IV correspondingly, of course, must be negative.

Now it shall be remarked that the readout or the detection of the polarization state at II will be destructive, as the logic element after the readout arrives in a polarization state represented by the point III and thereafter drifts back to the stable state at I. If the readout of the polarization state took place when the logic element already was in I, this polarization state will, of course, be retained. After a readout of the data storage device based on ferroelectric memory cells according to the invention, information hence may be regarded as destructed by all memory cells in the storage device being in the same logic state, either 0 or 1. In practice, this of course, corresponds to an erasing of information and need not have negative consequences if the stored information only shall be read once or if readout only is required in a particular application. If the original information still shall be stored, it will, however, be necessary with a reset or refresh. This may take place by switching the logic element which originally was in the polarization state II but which after the readout will be in the polarization state I, back to the polarization state II by applying a negative voltage for the reset and preferably with the same field strength as in the readout. The polarisation will then take place along the hysteresis loop from I to IV, where the field is turned off and the logic element drifts back to the original polarization state at II. The reset of a logic element to the original polarization state after a readout, which destructed this state, can automatically take place by suitable verification and monitoring procedures implemented over the control circuits of the data-processing device and may for instance be software controlled according to a readout protocol. For instance there will in the reset of the polarization state at I to II, in other words in the switching of the polarization state I to the polarization state II, once more be output a current signal with a transient and this may then constitute the verification signal. Also a correct readout of the polarization state I may be verified either by applying to the logic element a voltage with opposite sign and reading a strong current signal, but the logic element will then be switched from I to II and must hence be reset. It will in other words quickly be realized that dependent on the initial polarization states and a possible destruction during the readout, the use of verification procedures and reset procedures will be interchangeable. In order to easier show this reference may be made to the accompanying table which discloses the preferred modes for respectively readout, verification and/or reset, giving the polarity of the applied voltage as applicable, as well as resulting currency pulses denoted as low or high according to whether the polarization state is changing along the loop from I to III, possibly from IV to II, or from I to IV, possibly from II to III.

The procedure for read-out of data as discussed herein is regarded in spite of the destruction as very advantageous when using ferroelectric materials with a nearly square hysteresis loop, as is the case for VDF-TFE as it gives a reliable detection and verification and the reset partly takes place spontaneously or in combination with verification. A pure small-signal detection, for instance between II and V, is in this case more problematic with regard to discrimination and requires an accurate control of the read voltage. If the hysteresis loop on the contrary has a more gentle course between II and V, and between V and VI, small signal detection may yet be used and reliable detection be obtained without reaching the saturation state III, while the absence of a sharp voltage threshold at V makes it easy to avoid a destructive read-out.

As already stated the form of the hysteresis loop which is dependent on the material, will be of importance for the response which is detected in a readout. As the hysteresis loop is depicted in FIG. 7, it will be advantageous that the read voltage or the applied electric field which is used for detecting the polarization state is in the form of a threshold voltage, i.e. attains its maximum value immediately. Dependent of the polarization response and/or the time constant of the polarization it may be justified using a ramp voltage, i.e. a voltage which continuously increases to the desired maximum value which preferably will be twice the coercivity field or somewhat more.

element. It will hence in every case be possible with a distinct discrimination to discern between the polarization state I or polarization state II. By the detection of the polarization state II on the hysteresis loop and the use of positive read voltage the polarization will move from II to III and the output current, the displacement current and the resistive current component will have a response as shown in FIG. 8. The transient in the output current reaches a peak with a delay $\Delta t$ after application of the read voltage and appears in a time window $t_s$ which dependent on the sign of the field corresponds to one of the two steepest portions of the hysteresis loop of FIG. 7. As will be seen, the current signal is distinctly discriminated relative to the displacement current and the resistive current component. The detection may take place by sampling or as a level comparison, for instance in the time window $t_s$ which here for instance falls between V or VI on the hysteresis loop. The position of the time window on a time scale will depend on the polarization response for a given read voltage and the polarization properties of the ferroelectric material and the thin film parameters.

Another interesting feature when using a ferroelectric material based on vinylidene fluoride/trifluoroethylene copolymers VDF-TFE is that their switching characteristics will depend on the electric field strength, i.e. the electrode voltage. Hence a high polarization voltage will influence the switching time of a logic element realized in the said ferroelectric material in such a manner that the higher the electric field strength the shorter the switching time. Typical switching characteristics for a vinylidene/trifluoroethylene copolymer are shown in FIG. 9 which expresses the relationship between switching time and respectively the electrical flux density D and its derivative $\partial D/\partial \log t$ for different field strengths, where $\tau_s$ is given by time at which the derivative becomes a maximum. It will be seen, as the

TABLE

Preferred modes for readout, verification and reset, ef. FIG. 7

|  | Reading | | | Verification | | | Reset | | | |
|---|---|---|---|---|---|---|---|---|---|---|
|  | | | | | | | After reading | | After verification | |
|  | Voltage | Course | Current | Voltage | Course | Current | Voltage | Course | Voltage | Course |
| Initial positive polarization (I) | + | I→III | Low | − | I→IV | High | (none) | III→I (spontaneous) | + | IV→I (IV→II, III→I spontaneous) |
|  | − | I→IV | High | + | II→III | High | ≡verification | IV→I (IV→II, III→I spontaneous) | (none) | III→I (spontaneous) |
| Initial negative polarization (II) | + | II→III | High | − | I→IV | High | ≡verification | III→II (III→I, IV→II spontaneous) | (none) | IV→II (spontaneous) |
|  | − | II→IV | Low | + | II→III | High | (none) | IV→II (spontaneous) | − | III→II (III→I, IV→II spontaneous) |

In a passively addressable electrode matrix displacement currents and resistive current components may be generated. These may mask a weak output signal in the current mode, such it will appear on detection of the polarization state I, while a transient signal as it is obtained by detection of the polarization state II, will be clearly discriminated because the displacement currents in common dielectric materials very linearly with the field strength and appear instantly on application of the voltage, which also is the case of the resistive components. The resistive current components will further be present as long as the field is applied to the logic coercivity field of this copolymer is about 40 MV/m, that a field strength of 100 MV/m, i.e. almost 2.5 times the coercivity fields, will result in a switching time of $10^{-5}$ s, while the switching time for field strength insignificantly above that of the coercivity field, namely of 42 MV/m, gives a switching time of about 5 s. The switching time is in other words reduced with 5 or 6 orders of magnitude with such an increase of the field strength. On the other hand it is for different reasons not desirable using a too high field strength, for one thing in order to avoid undesired stray capacitances or sneak currents in the matrix network and discharges through the thin film.

If the data-processing device according to the invention is encumbered with impedance noise, it will be possible to provide current-amplifying line drivers connected to the logical elements in order to ensure noise immunity when driving for readout or switching. Such line drivers could possible be driven by the read/verification/reset voltage or over a separate supply line.

An embodiment of the data-processing device according to the invention and corresponding to FIG. 4 is shown in perspective in FIG. 10, but with possible substrates and isolating layers removed. It appears in FIG. 10 as a planar x,y electrode matrix and with the logic elements formed at each overlapping intersection between the electrodes 2; 3in the first and the second electrode structure, which here are mutually isolated by the isolating material 6. A planar matrix embodiment of this kind may be stacked layerwise in order to provide a volumetric data-processing device with k stacked planar structures $S_1, \ldots S_k$, as shown in FIG. 11. It must then be provided layers 7 of electrical isolating material between each planar structure S which in section will appear roughly as shown in FIG. 11. The electrodes 2,3 may be connected to not shown addressing and detection lines, i.e. current and voltage buses, e.g. provided in a semiconductor device made for this purpose, along the side edges of the volumetric device, or if the device is integrated as a hybrid device on silicon substrates, conveyed directly to drive voltage and control signal lines connected with driver and control units implemented in the silicon substrate in a compatible semiconductor technology. Addressing and detection may for instance take place in time multiplex or by using a logic addressing of each individual logic element. The number of logic addresses will then be the product of the number of stacked matrix structures or layers, the number of rows and the number of columns in each matrix structure. The number of separate addresses will be the sum of the number of x and y electrodes in a layer S and the number of layers $S_1, \ldots S_k$ in the device. The combination of time multiplex-based and logic addressing may besides be used in order to realize a massive parallel addressing which could provide very high write and read speeds. In this regard reference may also be made to the discussion of volumetrically implemented data-processing devices as they for instance are disclosed in International patent application PCT/NO97/00154 of the present applicant, or the discussion of the stacked electrode devices as they are disclosed in the above-mentioned Norwegian patent application 972803 of the present applicant.

It will be obvious to persons skilled in the art that the logic elements realized either as bistable switches or memory cells may be used to configure logic gates or be included as switches in processor networks and arithmetic registers, possibly integrated with the logic elements realized as memory modules, or that the logic elements all are realized as memory cells, such that the device in FIG. 11 will be a volumetric data device with high storage density. With the use of ferroelectric thin films it will be possible to achieve film thicknesses in the range of about 100 nm and corresponding electrode dimensions, something which implies that the voltages in order to generate the necessary field strengths will be in the range of about 10 volt. On one $\mu m^2$ it will then be possible to realize about 100 logic elements or memory cells, something which will imply a substantial improvement of the data storage density when compared to data storage devices of the ROM or RAM types based on conventional semiconductor technology.

What is claimed is:

1. A method for readout in the addressing of logic elements in a ferroelectric data-processing device, wherein the method supports a protocol for readout, the method comprising steps for respectively reading, verification and reset, including
applying in the reading step a voltage with a determined polarization to the logic element and detecting a charge transfer between electrodes thereof as an either high or low first current value indicative of a logical value stored in the logic element, applying in the verification step a voltage of the opposite polarity to a polarity of the voltage applied in the reading step and detecting a charge transfer between the electrodes of the logic element as a high second current value, and, in the case the logical value stored in the logic element was destroyed in the reading or the verification step, applying in the step for reset a voltage to the logic element restoring an initial polarization state thereof.

2. The method according to claim 1, further comprising performing reset after the reading step without verification by applying the voltage of the opposite polarity to the polarity of the reading voltage only in the case of detecting a high current signal in the reading step.

3. The method according to claim 1, wherein reset being performed after reading in conjunction with verification by applying the voltage of the same polarity as the polarity of the reading voltage only in the case of detecting a low current signal in the reading step.

4. The method according to claim 1, further comprising applying a voltage which between the electrodes of the logic element generates a field strength which is more than twice a coercivity field of the ferroelectric material.

5. The method according to claim 1, further comprising generating the applied voltage in at least one of the reading and verification steps as a ramp voltage.

6. The method according to claim 1, further comprising generating the applied voltage in at least one of the reading and verification steps as a threshold voltage.

7. The method according to claim 1, wherein the current detection takes place by sampling in the time domain.

8. The method according to claim 7, when the current detection takes place by a level comparison.

9. The method according to claim 1, wherein the current detection in the reading step taking place in a time window dependent on a saturation time constant of the polarization.

* * * * *